United States Patent
Goktepeli et al.

(10) Patent No.: US 11,309,352 B2
(45) Date of Patent: Apr. 19, 2022

(54) INTEGRATED ACOUSTIC FILTER ON COMPLEMENTARY METAL OXIDE SEMICONDUCTOR (CMOS) DIE

(71) Applicant: QUALCOMM Incorporated, San Diego, CA (US)

(72) Inventors: Sinan Goktepeli, San Diego, CA (US); Stephen Alan Fanelli, San Marcos, CA (US); Yun Han Chu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 16/116,744

(22) Filed: Aug. 29, 2018

(65) Prior Publication Data

US 2019/0273116 A1    Sep. 5, 2019

Related U.S. Application Data

(60) Provisional application No. 62/637,284, filed on Mar. 1, 2018.

(51) Int. Cl.
| | |
|---|---|
| *H01L 27/00* | (2006.01) |
| *H01L 27/20* | (2006.01) |
| *H03H 9/05* | (2006.01) |
| *H03H 9/56* | (2006.01) |
| *H03H 3/02* | (2006.01) |

(Continued)

(52) U.S. Cl.
CPC .......... *H01L 27/20* (2013.01); *B81C 1/00246* (2013.01); *H03H 3/0073* (2013.01); *H03H 3/02* (2013.01); *H03H 3/08* (2013.01); *H03H 9/0547* (2013.01); *H03H 9/0557* (2013.01); *H03H 9/0561* (2013.01); *H03H 9/1014* (2013.01); *H03H 9/1071* (2013.01); *H03H 9/465* (2013.01); *H03H 9/545* (2013.01); *H03H 9/564* (2013.01); *H03H 9/64* (2013.01); *B81B 2201/0271* (2013.01); *H03H 9/0571* (2013.01);

(Continued)

(58) Field of Classification Search
CPC .... H01L 27/20; B81C 1/00246; H03H 3/0073
See application file for complete search history.

(56) References Cited

U.S. PATENT DOCUMENTS

| | | | |
|---|---|---|---|
| 7,596,849 B1 | 10/2009 | Carpenter et al. | |
| 9,647,636 B1 | 5/2017 | Elsherbini et al. | |

(Continued)

OTHER PUBLICATIONS

International Search Report and Written Opinion—PCT/US2019/013344—ISA/EPO—dated Apr. 1, 2019.

*Primary Examiner* — Mounir S Amer
*Assistant Examiner* — Alexander Belousov
(74) *Attorney, Agent, or Firm* — Seyfarth Shaw LLP/Qualcomm Incorporated

(57) ABSTRACT

A radio frequency (RF) front-end (RFFE) device includes a die having a front-side dielectric layer on an active device. The active device is on a first substrate. The RFFE device also includes a microelectromechanical system (MEMS) device. The MEMS device is integrated on the die at a different layer than the active device. The MEMS device includes a cap layer composed of a cavity in the front-side dielectric layer of the die. The cavity in the front-side dielectric layer is between the first substrate and a second substrate. The cap is coupled to the front-side dielectric layer.

16 Claims, 12 Drawing Sheets

(51) Int. Cl.

| | | |
|---|---|---|
| *H03H 3/08* | (2006.01) | |
| *H03H 9/64* | (2006.01) | |
| *H03H 3/007* | (2006.01) | |
| *H03H 9/10* | (2006.01) | |
| *H03H 9/54* | (2006.01) | |
| *H03H 9/46* | (2006.01) | |
| *B81C 1/00* | (2006.01) | |
| *H03H 1/00* | (2006.01) | |

(52) U.S. Cl.
CPC ... *H03H 9/0576* (2013.01); *H03H 2001/0064* (2013.01); *H03H 2003/021* (2013.01)

(56) References Cited

U.S. PATENT DOCUMENTS

| | | |
|---|---|---|
| 2006/0202779 A1 | 9/2006 | Fazzio et al. |
| 2013/0119491 A1 | 5/2013 | Luce et al. |
| 2015/0191344 A1* | 7/2015 | Sadaka ............... B81C 1/00238 257/774 |
| 2016/0095221 A1* | 3/2016 | Ramachandran .... H05K 3/4038 361/783 |
| 2016/0332867 A1* | 11/2016 | Tseng ........................ B81B 7/02 |
| 2016/0336990 A1 | 11/2016 | Petzold et al. |
| 2017/0134000 A1 | 5/2017 | Tsai et al. |
| 2017/0264265 A1 | 9/2017 | Huang et al. |
| 2018/0003677 A1 | 1/2018 | Oster et al. |

* cited by examiner

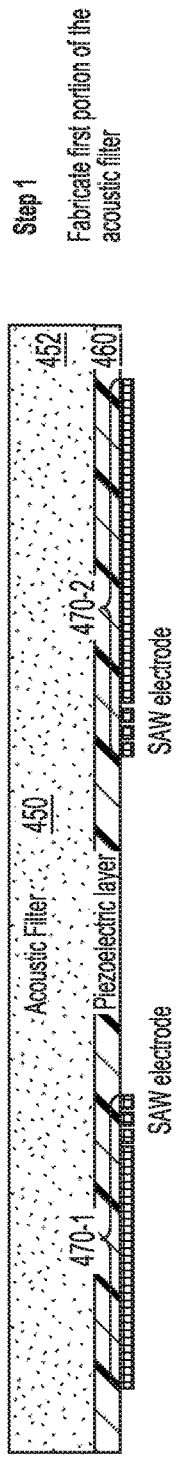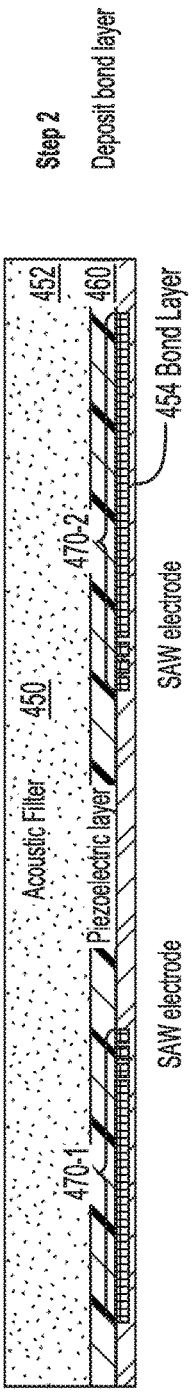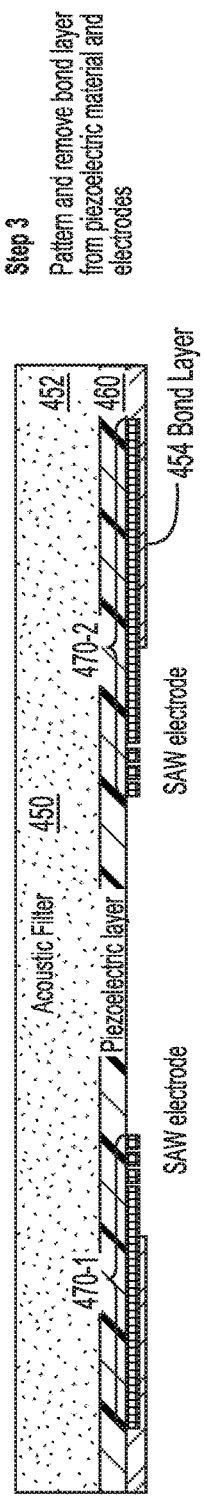

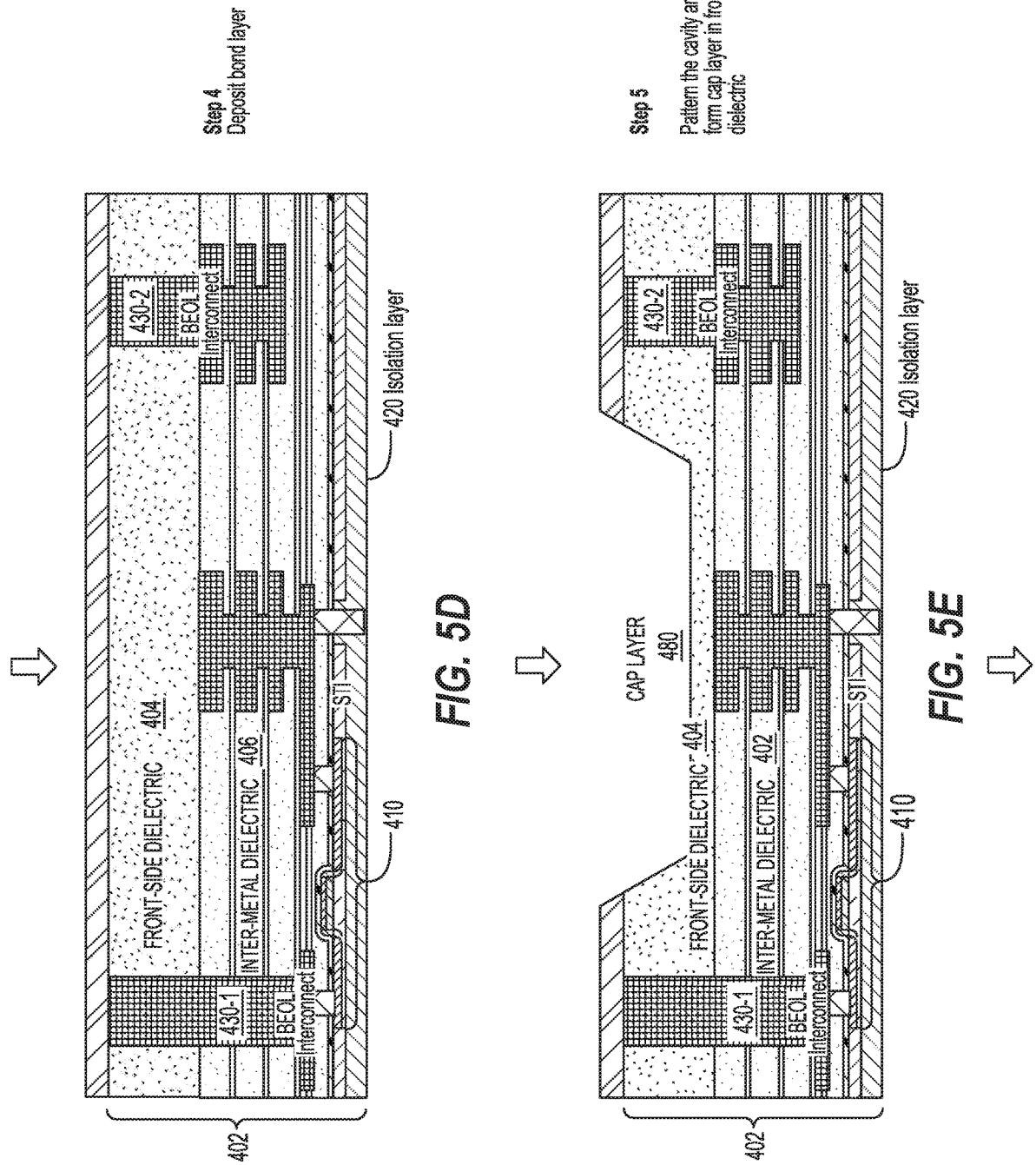

INTEGRATED ACOUSTIC FILTER ON COMPLEMENTARY METAL OXIDE SEMICONDUCTOR (CMOS) DIE

CROSS-REFERENCE TO RELATED APPLICATION

This application claims the benefit of U.S. Provisional Patent Application No. 62/637,284, filed on Mar. 1, 2018, entitled "COMPOUND SEMICONDUCTOR FIELD EFFECT TRANSISTOR WITH SELF-ALIGNED GATE," the disclosure of which is expressly incorporated by reference herein in its entirety.

TECHNICAL FIELD

Aspects of the present disclosure generally relate to integrated circuits (ICs). More specifically, aspects of the present disclosure relate to integrating a microelectromechanical system (MEMS) device (e.g., an acoustic filter) on a complementary metal oxide semiconductor (CMOS) chip.

BACKGROUND

Designing mobile radio frequency (RF) chips (e.g., mobile RF transceivers) is complicated by added circuit functions for support of communication enhancements, such as fifth-generation (5G) wireless systems. Further design challenges for mobile RF transceivers include analog/RF performance considerations, including mismatch, noise, and other performance considerations. Designing these mobile RF transceivers may include using additional passive devices, for example, for suppressing resonance, and/or for performing filtering, bypassing, and coupling.

These mobile RF transceivers may be designed using RF filters. For example, mobile RF transceivers in wireless communication systems generally rely on RF (e.g., acoustic) filters for processing signals carried in the wireless communication system. Many passive devices may be included in these RF filters. In practice, each of these passive devices may include many inductors and capacitors.

These RF filters may include surface acoustic wave (SAW), as well as bulk acoustic wave (BAW) filters. Successful operation of acoustic filters generally involves reliance on a piezoelectric effect. The piezoelectric effect is a special property of materials to exchange energy between the mechanical and the electrical domains. For example, in BAW resonators, converse piezoelectricity (e.g., change in device dimensions with an applied electric field) is exploited. In this example, when an RF variable signal is applied to the electrodes, an acoustic longitudinal wave is created in the material.

Current SAW filters, as well as BAW filter packages, include 2D inductors on a capping wafer. The capping wafer enables control over the mass and the acoustic and electrical properties of the filter. Unfortunately, integrating high performance acoustic (e.g., SAW/BAW) filters on a complementary metal oxide semiconductor (CMOS) wafer is problematic. In particular, extremely complex processes generally prohibit integrating acoustic filters with CMOS wafers. Integration of an acoustic filter on a CMOS die would be desirable.

SUMMARY

A radio frequency (RF) front-end (RFFE) device is described. The RFFE device includes a die having a front-side dielectric layer on an active device. The active device is on a first substrate. The RFFE device also includes a microelectromechanical system (MEMS) device. The MEMS device is integrated on the die at a different layer than the active device. The MEMS device includes a cap layer composed of a cavity in the front-side dielectric layer of the die. The cavity in the front-side dielectric layer is between the first substrate and a second substrate. The cap is coupled to the front-side dielectric layer.

A method of integrating an acoustic filter on a complemental metal oxide semiconductor (CMOS) wafer includes patterning and etching a cavity in a front-side dielectric layer of the CMOS wafer. The cavity in the front-side dielectric layer may be distal from an active device layer of the CMOS wafer. The method also includes bonding the front-side dielectric layer of the CMOS wafer to a front-side of a semiconductor handle wafer including portions of the acoustic filter. The acoustic filter may include a cap layer having the cavity in the front-side dielectric layer.

A radio frequency (RF) front-end (RFFE) device is described. The RFFE device includes an RFFE die. The RFFE die includes a front-side dielectric layer on an active device. The RFFE device also includes an acoustic filter integrated on the RFFE die. The acoustic filter has a cap layer composed of a cavity in the front-side dielectric layer of the die, between the first substrate and a second substrate. The cap layer is coupled to the front-side dielectric layer. The RFFE device also includes an antenna coupled to an output of the acoustic filter.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A-5F illustrates a process of integrating an acoustic filter on a complementary metal oxide semiconductor (CMOS) die using a layer transfer process, according to aspects of the present disclosure.

DETAILED DESCRIPTION

Figure 1:
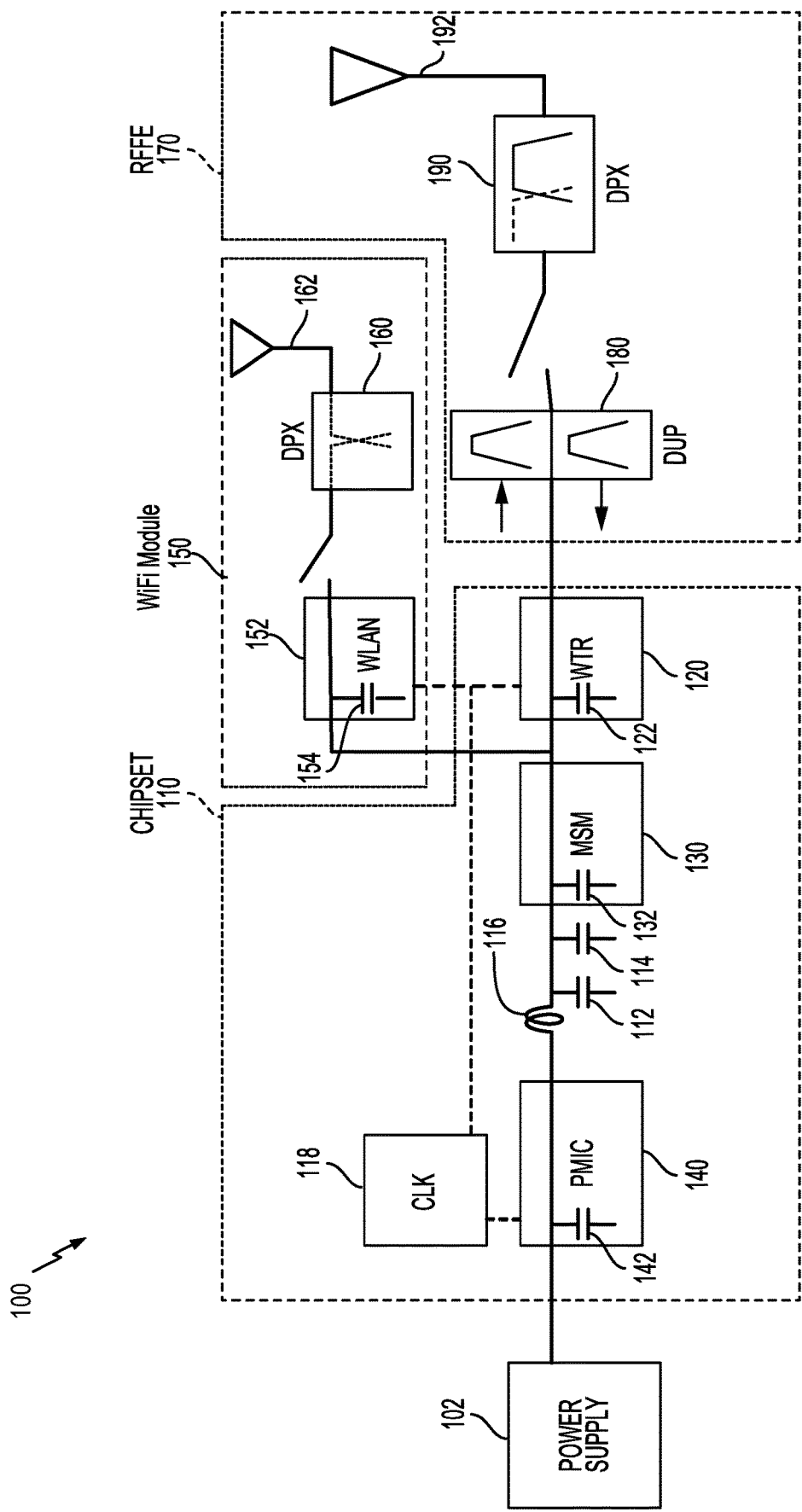
FIG. 1 is a schematic diagram of a wireless device having a wireless local area network module and a radio frequency (RF) front-end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Mobile RF chips are a major driving force for advancing miniaturization of electronics. While tremendous improvements are being realized for miniaturizing wireless communication subsystems, such as mobile RF transceivers, acoustic filters have not experienced such improvements.

These mobile RF transceivers may be designed using RF filters. For example, mobile RF transceivers in wireless communication systems generally rely on RF (e.g., acoustic) filters for processing signals carried in the wireless communication system. Many passive devices may be included in these RF filters. In practice, each of these passive devices may include many inductors and capacitors. Designing RF filters for mobile RF transceivers involves analog/RF performance considerations, including mismatch, noise and other performance considerations. Designing these RF filters in mobile RF transceivers may include using additional passive devices, for example, for suppressing resonance, and/or for performing filtering, bypassing, and coupling.

These RF filters may include surface acoustic wave (SAW), as well as bulk acoustic wave (BAW) filters. Successful operation of acoustic filters generally involves reliance on a piezoelectric effect. The piezoelectric effect is a special property of materials to exchange energy between the mechanical and the electrical domains. For example, in BAW resonators, converse piezoelectricity (e.g., change in device dimensions with an applied electric field) is exploited. In this example, when an RF variable signal is applied to the electrodes, an acoustic longitudinal wave is created in the material.

A SAW filter is a different type of filter than a BAW filter. In a SAW filter, an electrical input signal is converted to an acoustic wave by interdigital transducers (IDTs) on a piezoelectric substrate of the SAW filter. The interdigital transducers may be composed of interleaved, conductive electrodes that are used to launch and receive the acoustic waves. In a SAW filter, an electrical signal is converted to an acoustic wave and then back to an electrical signal.

Current SAW filters, as well as BAW filter packages, include 2D inductors on a capping wafer. The capping wafer enables control over the mass and the acoustic and electrical properties of the filter. Unfortunately, integrating high performance acoustic (e.g., SAW/BAW) filters on a complementary metal oxide semiconductor (CMOS) wafer is problematic. In particular, extremely complex processes generally prohibit integrating acoustic filters on CMOS wafers.

Various aspects of the present disclosure provide techniques for integrating an acoustic filter on a CMOS die using a layer transfer process. The process flow for semiconductor fabrication of the layer transferred RF filter-on-insulator wafer may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Aspects of the present disclosure relate to a microelectromechanical system (MEMS) device (e.g., an acoustic filter) integrated on a CMOS die using a layer transfer process. In this aspect of the present disclosure, a radio frequency (RF) front-end (RFFE) device includes a complementary metal oxide semiconductor (CMOS) die including a front-side dielectric layer on an active device, in which the active device is on a first substrate (e.g., a semiconductor-on-insulator (SOI) wafer). The RFFE device also includes an acoustic filter integrated on the CMOS die at a different layer than the active device. In this aspect of the present disclosure, the acoustic filter includes a cap layer having a cavity in the front-side dielectric layer of the CMOS die, between the first substrate and a second substrate (e.g., a semiconductor handle wafer) coupled to the front-side dielectric layer.

In one aspect of the present disclosure, a semiconductor handle wafer of the acoustic filter is bonded to the front-side dielectric layer of the CMOS die to form an on-chip acoustic filter. The on-chip acoustic filter may include a filter layer (e.g., piezoelectric layer) for implementing a BAW filter using a proprietary layer transfer process. The piezoelectric layer may be composed of a lithium tantalate (LT) and/or a lithium niobate (LN) material, or other like piezoelectric material. The on-chip acoustic filter may also be implemented as a SAW filter. The CMOS die may be implemented using a semiconductor on insulator (SOI) wafer, a bulk semiconductor wafer, or other like CMOS wafer.

FIG. 1 is a schematic diagram of a wireless device 100 (e.g., a cellular phone or a smartphone) having an on-chip acoustic filter, according to aspects of the present disclosure. The wireless device may include a wireless local area network (WLAN) (e.g., WiFi) module 150 and an RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

In this configuration, the wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device 100 generally includes a mobile RF transceiver to transmit and receive data for two-way communication. A mobile RF transceiver may include a transmit section for transmitting data and a receive section for receiving data. For transmitting data, the transmit section modulate an RF carrier signal with data for obtaining a modulated RF signal, amplifying the modulated RF signal using a power amplifier (PA) for obtaining an amplified RF signal having the proper output power level, and transmitting the amplified RF signal via the antenna 192 to a base station. For receiving data, the receive section may obtain a received RF signal via the antenna 192, in which the received RF signal is amplified using a low noise amplifier (LNA) and processed for recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

In FIG. 1, the wireless transceiver 120 and the RF front-end module 170 may be implemented using complementary metal oxide semiconductor (CMOS) technology. This CMOS technology may be used for fabricating transistors of the wireless transceiver 120 and the RF front-end module 170, which helps reduce out-of-band, high order harmonics in the RF front-end module 170. A layer transfer (LT) process for further separating an active device from a supporting substrate is described in FIGS. 2A to 2D.

Figure 2A:
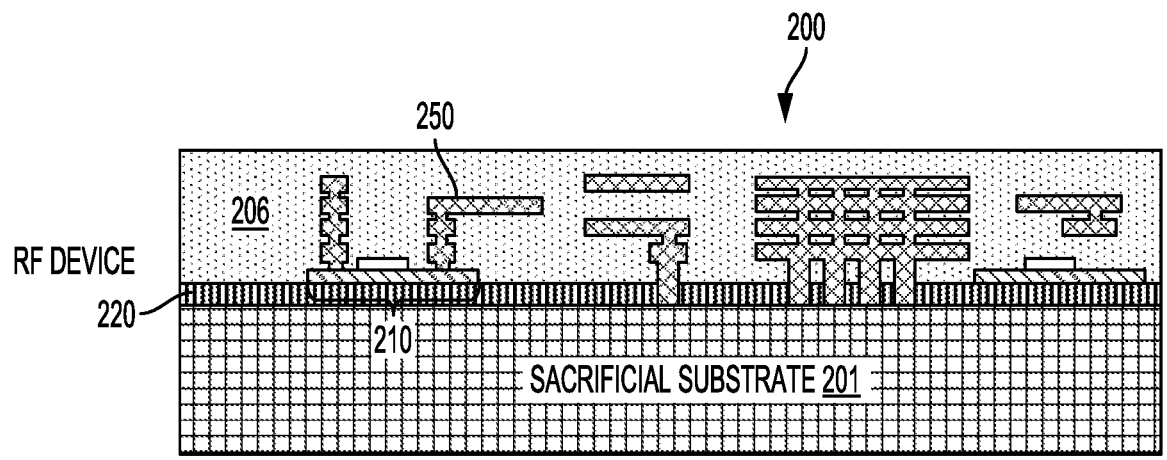
FIGS. 2A to 2D show cross-sectional views of a radio frequency (RF) integrated circuit during a layer transfer process.
Figure 2B:
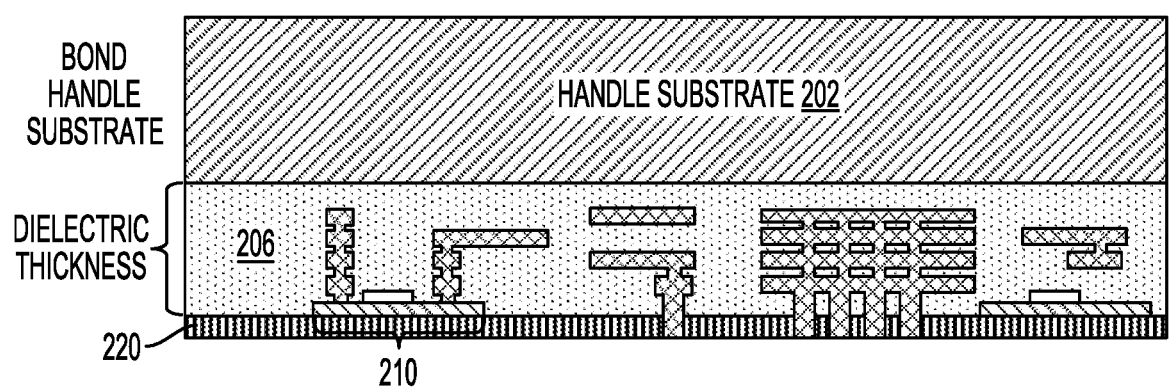

FIGS. 2A to 2D show cross-sectional views of a radio frequency (RF) integrated circuit 200 during a layer transfer process, according to aspects of the present disclosure. As shown in FIG. 2A, an RF device includes an active device 210 on an isolation layer 220 supported by a sacrificial substrate 201 (e.g., a bulk wafer). The RF device also includes interconnects 250 coupled to the active device 210 within a first dielectric layer 206. As shown in FIG. 2B, a handle substrate 202 is bonded to the first dielectric layer 206 of the RF device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF device is proportional to the dielectric thickness, which determines the distance between the active device 210 and the handle substrate 202.

Figure 2C:
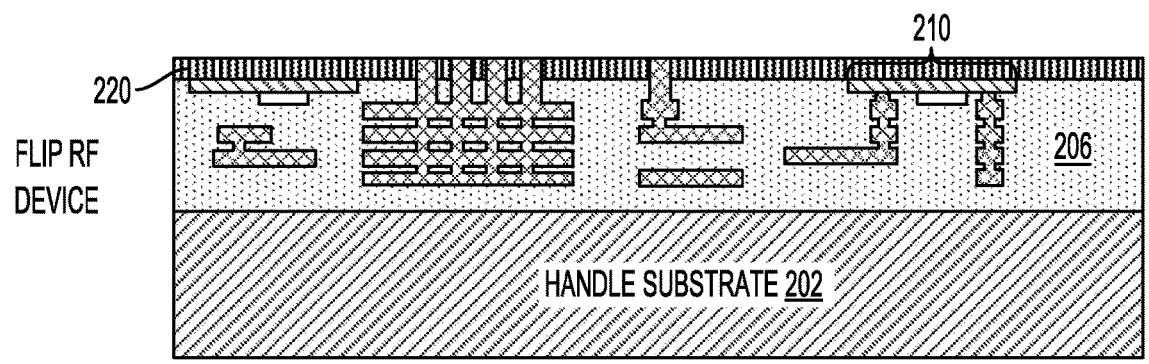
Figure 2D:
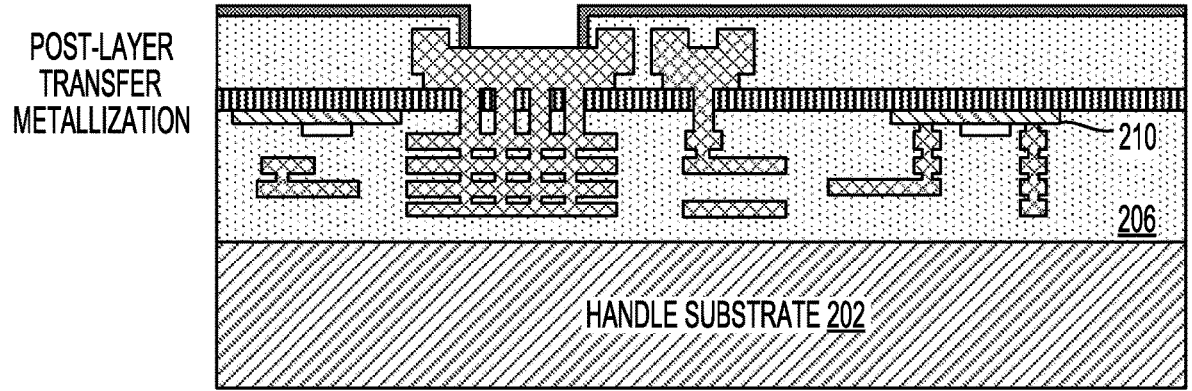

As shown in FIG. 2C, the RF device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

Figure 3:
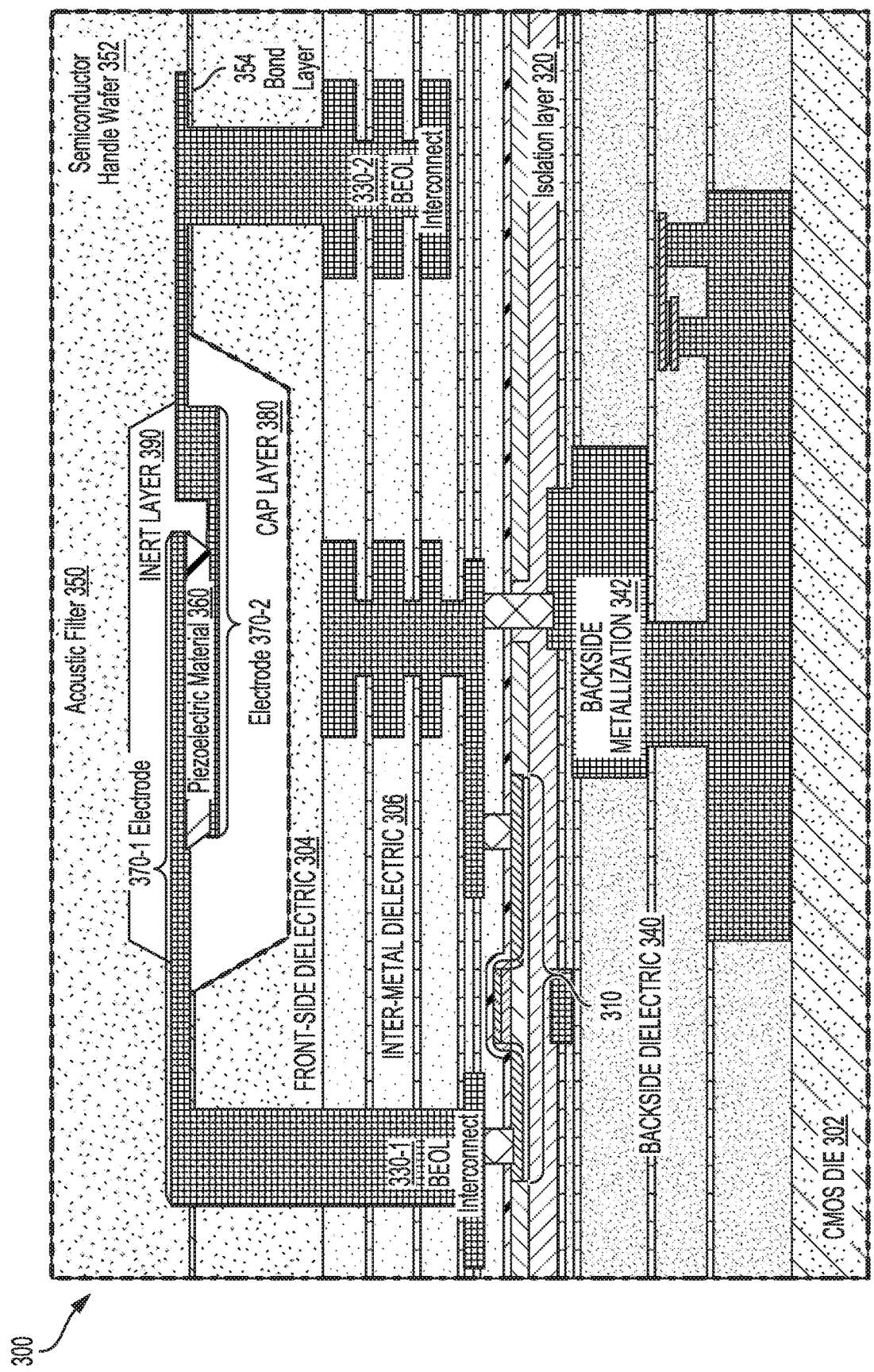
FIG. 3 is a cross-sectional view of a bulk acoustic wave (BAW) filter integrated on a complementary metal oxide semiconductor (CMOS) die, according to aspects of the present disclosure.
Figure 4:
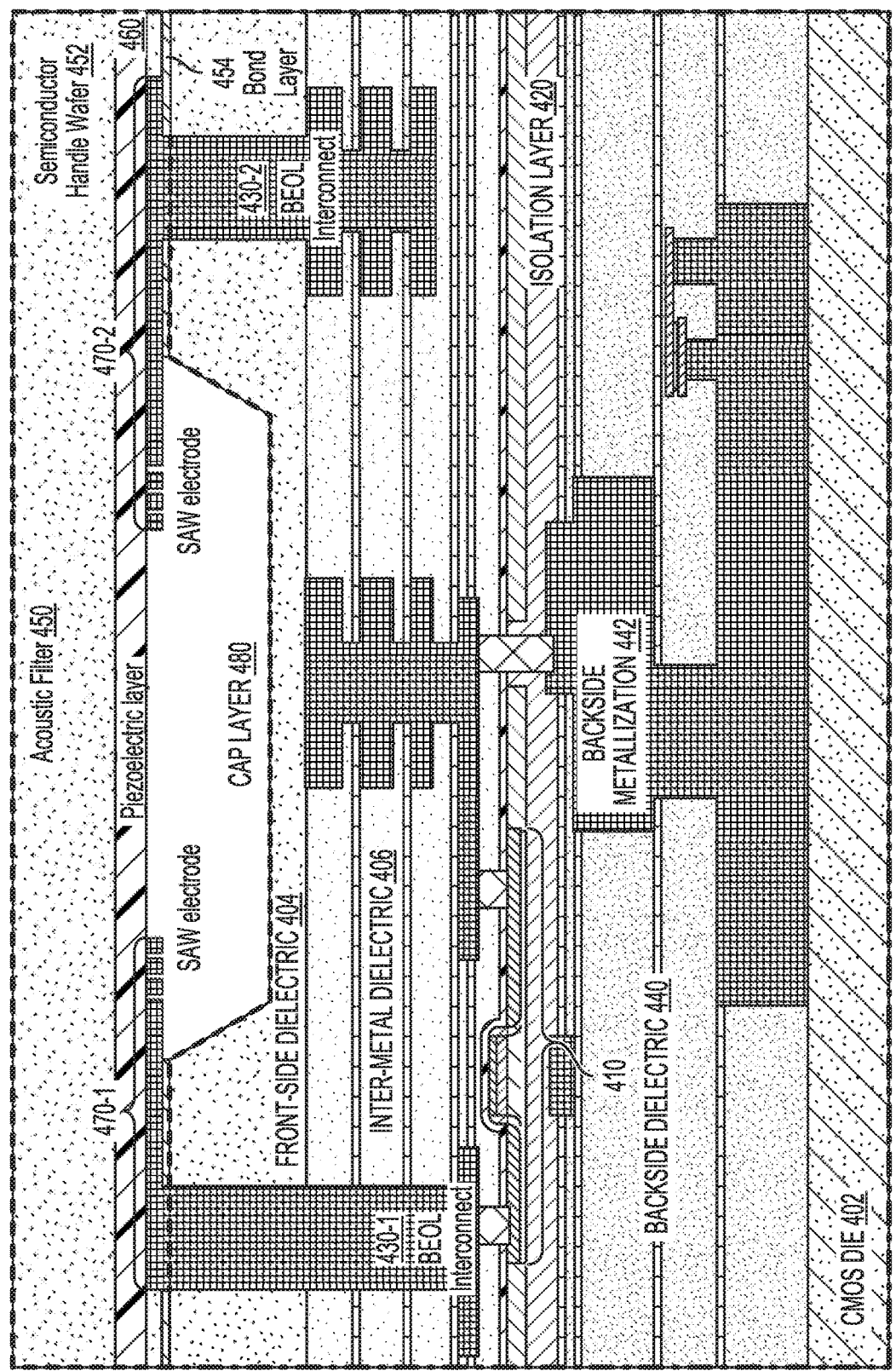
FIG. 4 is a cross-sectional view of a surface acoustic wave (SAW) filter integrated on a complementary metal oxide semiconductor (CMOS) die, according to aspects of the present disclosure.
Figure 5F:
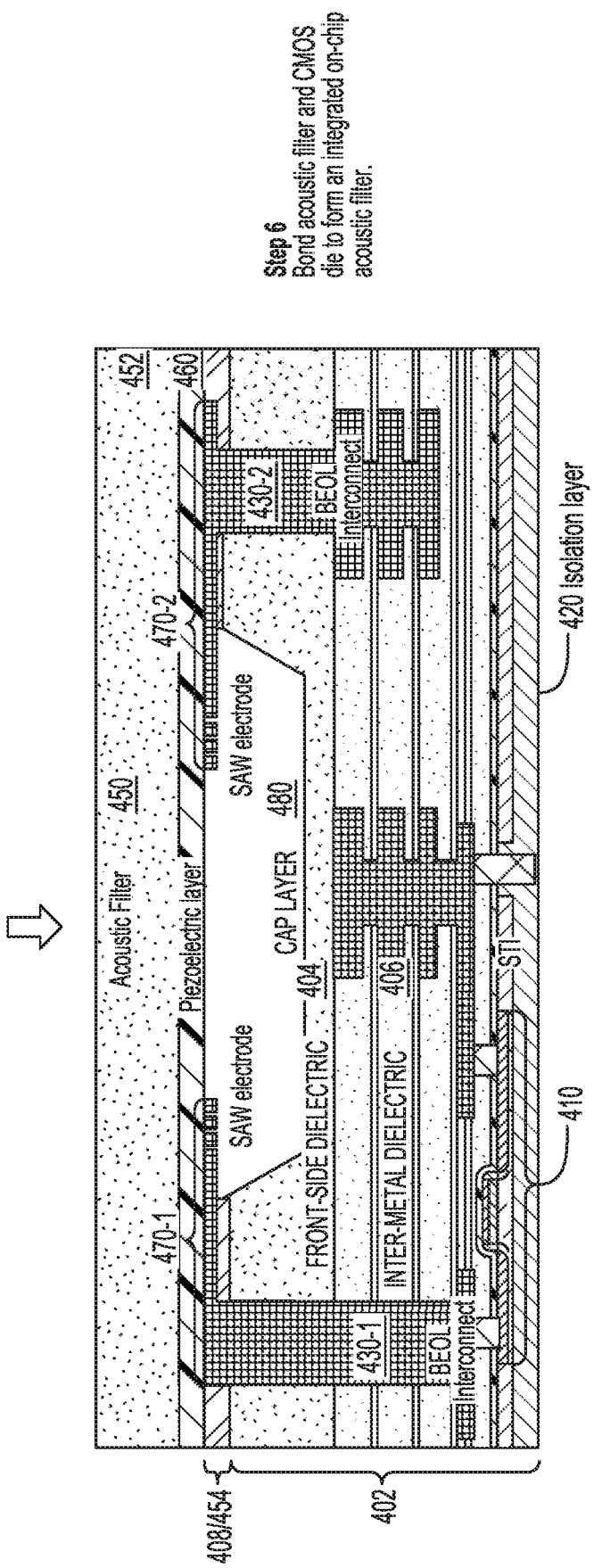

Various aspects of the present disclosure provide techniques for fabricating an on-chip acoustic filter, such as an on-chip bulk acoustic wave (BAW) filter shown in FIG. 3 or an on-chip surface acoustic wave (SAW) filter shown in FIG. 4. Although described with reference to an acoustic filter, it should be recognized that aspects of the present disclosure also relate to microelectromechanical system (MEMS) devices, such as MEMS filters, or other like filter devices.

FIG. 3 is a cross-sectional view of a bulk acoustic wave (BAW) filter integrated on a complementary metal oxide semiconductor (CMOS) die, according to aspects of the present disclosure. Although described with reference to a CMOS die, it should be recognized that aspects of the present disclosure are not limited to a CMOS die. For example, a die according to aspects of the present disclosure may include a compound semiconductor die, a radio frequency (RF) die, or other like semiconductor die.

In this configuration, a radio frequency (RF) front-end (RFFE) device 300 includes an acoustic filter 350 bonded to a front-side dielectric layer 304 of a CMOS die 302. The acoustic filter 350 may include a semiconductor handle wafer 352, having a front-side that is bonded to the front-side dielectric layer 304 of the CMOS die 302 through a bond layer 354. The bond layer 354 may be provided on both wafers or on only one of the wafers.

In this aspect of the present disclosure, the acoustic filter 350 includes a cap layer 380 with a cavity in the front-side dielectric layer 304 of the CMOS die 302. In conventional acoustic filters, a capping wafer enables control over the mass and the acoustic and electrical properties of the filter. In this configuration, the capping wafer is provided by the front-side dielectric layer 304 of the CMOS die 302. In this example, the acoustic filter 350 is implemented as a BAW filter, including a piezoelectric material 360 between a first electrode 370-1 and a second electrode 370-2. The acoustic filter 350 may optionally include an inert layer 390 filled with an inert gas in a cavity in the semiconductor handle wafer 352. An inert gas can also fill the cavity in the front-side dielectric layer 304. In one configuration, the cavity in the semiconductor handle wafer 352 is vacuumed to form a low pressure inert gas as the inert layer 390.

The CMOS die 302 may include a first back-end-of-line (BEOL) interconnect 330-1 between an active device 310 and the first electrode 370-1 of the acoustic filter 350. The CMOS die 302 may also include a second BEOL interconnect 330-2 in an inter-metal dielectric (IMD) layer 306 and coupled to the second electrode 370-2 of the acoustic filter 350. The CMOS die 302 may include an isolation layer 320 (e.g., for a semiconductor-on-insulator (SOI) implementation). The CMOS die 302 is also shown to include a backside metallization 342 in a backside dielectric layer 340.

FIG. 4 is a cross-sectional view of a surface acoustic wave (SAW) filter integrated on a complementary metal oxide semiconductor (CMOS) device, according to aspects of the present disclosure. In this configuration, an RFFE device 400 includes an acoustic filter 450 bonded to a front-side dielectric layer 404 of a CMOS die 402. The acoustic filter 450 also include a semiconductor handle wafer 452, having a front-side that is bonded to the front-side dielectric layer 404 of the CMOS die 402 through a bond layer 454. The bond layer 454 may be provided on both wafers or on only one of the wafers.

In this aspect of the present disclosure, the acoustic filter 450 also includes a cap layer 480 with a cavity in the front-side dielectric layer 404 of the CMOS die 402. In this configuration, the front-side dielectric layer 404 of the CMOS die 402 provides a capping wafer to control the mass and the acoustic and electrical properties of the acoustic filter 450. In this example, the acoustic filter 450 is implemented as a SAW filter, including a piezoelectric layer 460 on a front-side surface of the semiconductor handle wafer 452. The acoustic filter 450 also includes a first electrode 470-1 and a second electrode 470-2 on the piezoelectric layer 460.

The CMOS die 402 includes a first BEOL interconnect 430-1 between an active device 410 (e.g., a switch transistor) and the first electrode 470-1 of the acoustic filter 450. The CMOS die 402 also includes a second BEOL interconnect 430-2 in an inter-metal dielectric (IMD) layer 406 and coupled to the second electrode 470-2 of the acoustic filter 450. The CMOS die 402 may have an isolation layer 420 (e.g., for a semiconductor-on-insulator (SOI) implementation). The CMOS die 402 is shown to include a backside metallization 442 in a backside dielectric layer 440.

An on-chip acoustic filter, according to aspects of the present disclosure, may be fabricated according to a layer transfer process shown in FIGS. 5A-5F. FIGS. 5A-5F illustrate a process 500 of integrating an acoustic filter on a complementary metal oxide semiconductor (CMOS) die using a layer transfer process, according to aspects of the present disclosure. The process 500 may enable fabrication of, for example, the RFFE device 400 of FIG. 4, including an acoustic filter 450 on a CMOS die 402, according to aspects of the present disclosure.

In Step 1 shown in FIG. 5A, a first portion of the acoustic filter 450 is fabricated on the semiconductor handle wafer 452. As also shown in FIG. 4, the first portion of the acoustic filter 450 includes a piezoelectric layer 460 on the front-side surface of the semiconductor handle wafer 452. The acoustic filter 450 also includes the first electrode 470-1 and the second electrode 470-2 on the piezoelectric layer 460.

In Step 2 shown in FIG. 5B, the bond layer 454 is deposited on the piezoelectric layer 460, the first electrode 470-1, and the second electrode 470-2 of the acoustic filter 450. In Step 3 shown in FIG. 5C, the bond layer 454 is patterned and etched to expose a portion of the piezoelectric layer 460 and portions of the first electrode 470-1 and the second electrode 470-2 of the acoustic filter 450. In Step 4 shown in FIG. 5D, a bond layer 408 is deposited on a front-side dielectric layer 404 of the CMOS die 402. The bond layer 408 on the front-side dielectric layer 404 and the bond layer 454 on the acoustic filter 450 may be composed of a dielectric to form a dielectric-dielectric bonding.

Alternatively, the bond layer 454 may be polysilicon deposited on the CMOS die 402 and an oxide deposited on the acoustic filter 450 to form a silicon-dielectric bonding. In Step 5 shown in FIG. 5E, the CMOS die 402 is patterned and etched to form a cavity (e.g., cap layer 480) in the front-side dielectric layer 404. The cavity for providing the cap layer 480 is distal from an active device layer (e.g., the active device 410) of the CMOS die 402. The cap layer 480 may have a depth in the sub-micron range (e.g., 0.1 to 0.2 microns). In Step 6 shown in FIG. 5F, the bond layer 408 on the front-side dielectric layer 404 and the bond layer 454 on the acoustic filter 450 are pressure bonded to complete formation of the RFFE device 400 including an integrated on-chip acoustic filter.

Figure 6:
FIG. 6 illustrates a process of fabricating the BAW filter of FIG. 3, according to aspects of the present disclosure.
Figure 6:
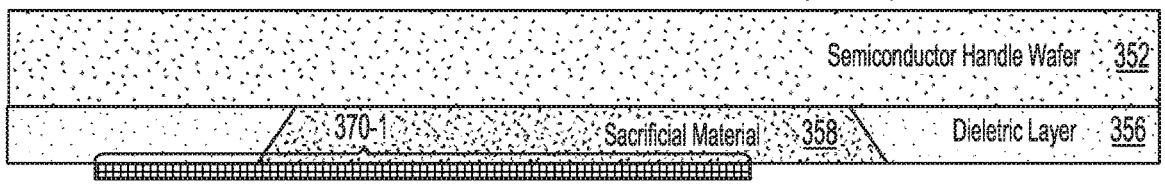
Figure 6:
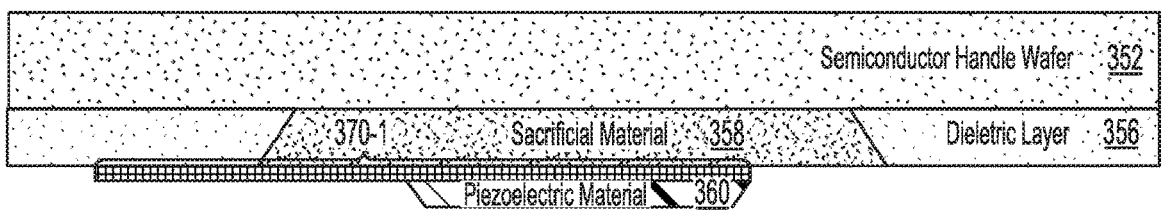
Figure 6:
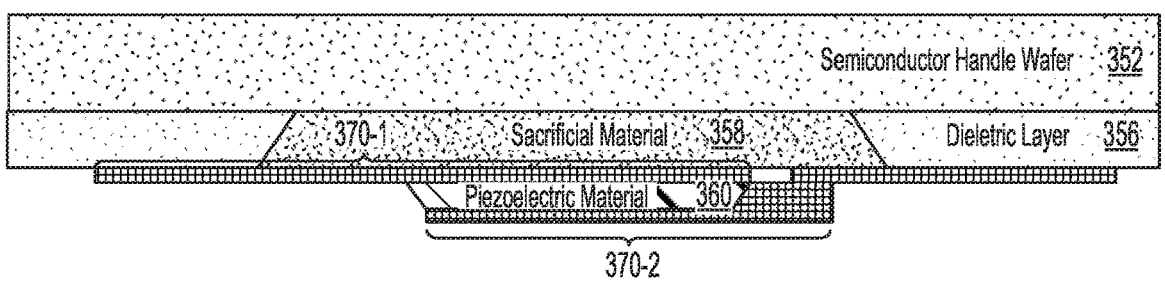
Figure 6:
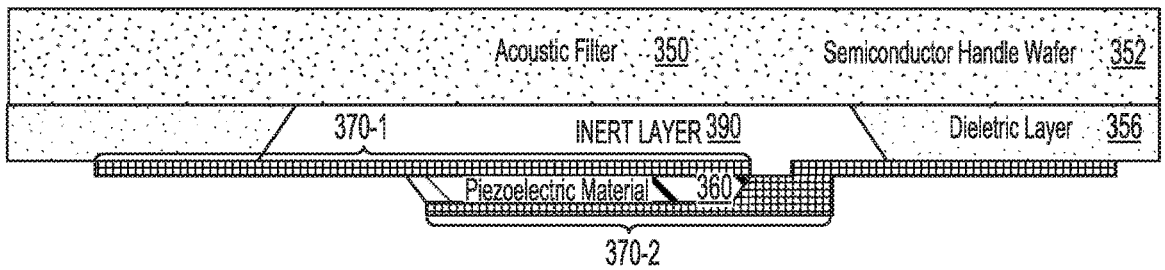

FIG. 6 illustrates a BAW process 600 of fabricating the acoustic filter 350 of FIG. 3 based on a bulk acoustic wave (BAW) filter process, according to aspects of the present disclosure. The BAW process 600 may enable fabrication of, for example, the RFFE device 300 of FIG. 3 including a BAW filter as the acoustic filter 350 on the CMOS die 302, according to aspects of the present disclosure.

In Step 1, a dielectric layer 356 (e.g., silicon nitride (SiN)) is deposited on the semiconductor handle wafer 352. The dielectric layer 356 is patterned and etched to form a cavity. A sacrificial material 358 (e.g., an oxide/dielectric) is then deposited on the dielectric layer 356 to fill the cavity, and the sacrificial material 358 is subjected to a chemical mechanical polishing (CMP) to form the sacrificial material 358 coplanar with the dielectric layer 356.

As further shown in FIG. 6, in Step 2, a first conductive material is deposited on a coplanar surface of the sacrificial material 358 and the dielectric layer 356 and patterned to form the first electrode 370-1. In Step 3, the piezoelectric material 360 (e.g., aluminum nitride (AlN)) is deposited and patterned on the first electrode 370-1. In Step 4, a second conductive material is deposited on the piezoelectric material 360, the sacrificial material 358, and the dielectric layer 356 and patterned to form the second electrode 370-2. In Step 5, the sacrificial material 358 is exposed to an etch process (e.g., a hydrofluoric (HF) vapor etch) to remove any sacrificial material 358 to form the inert layer 390 and complete formation of the acoustic filter 350. It is noted that the structure is a 3D structure, although shown in FIG. 6 as a 2D structure. Access to the sacrificial material 358 is available in the Z-direction (perpendicular to the plane of the paper) to expose the sacrificial material 358 to the etch process and forming the inert layer 390.

Aspect of the present disclosure describe a layer transfer and bonding processes for fabricating an integrated on-chip acoustic filter, for example, as shown in FIGS. 3 and 4. Although described with reference to a BAW filter and a SAW filter, it should be recognized that other RF microelectromechanical system (MEMS) filters may be fabricated according to aspects of the present disclosure, for example, as shown in FIG. 7.

Figure 7:
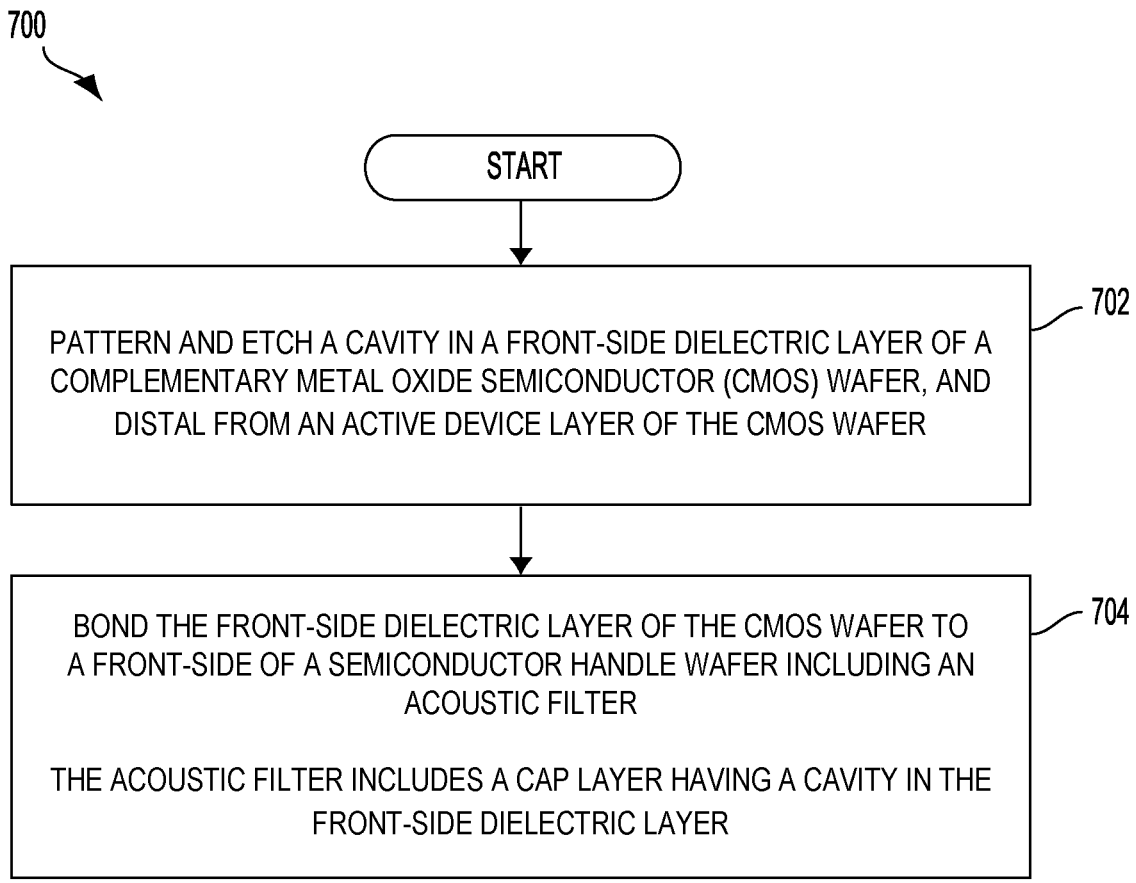
FIG. 7 is a process flow diagram illustrating a method of integrating an acoustic filter on a complementary metal oxide semiconductor (CMOS) die using a layer transfer process, according to aspects of the present disclosure.

FIG. 7 is a process flow diagram illustrating a method 700 of integrating an acoustic filter on a complementary metal oxide semiconductor (CMOS) wafer using a layer transfer process, according to aspects of the present disclosure. At block 702, the CMOS wafer is patterned and etched to form a cavity in a front-side dielectric layer of the CMOS wafer. For example, as shown in FIG. 3, the cap layer 380 is formed in the front-side dielectric layer, and distal from an active device layer (e.g., the active device 310) of the CMOS die 302.

In block 704, the front-side dielectric layer of the CMOS wafer is bonded to a front-side of a semiconductor handle wafer of the acoustic filter. As shown in FIG. 3, the acoustic filter 350 includes the cap layer 380 having the cavity in the front-side dielectric layer 304 of the CMOS die 302. As shown in FIG. 5A, the acoustic filter 450 is bonded to the CMOS die 402 through the bond layer 408 and the bond layer 454. The bond layers may be composed of a dielectric-dielectric bond and/or a semiconductor-dielectric bond.

In an alternative configuration, the acoustic filter 450 is bonded to the CMOS die 402 by vacuum bonding the front-side dielectric layer 404 of the CMOS die 402 to the front-side of the semiconductor handle wafer 452. In addition, low temperature bonding may be used to bond the front-side dielectric layer 404 of the CMOS die 402 to the front-side of the semiconductor handle wafer 452, for example, as shown in FIG. 4. Patterning and etching the bond layer 454 can be performed to expose a portion of the piezoelectric layer 460 and portions of the first electrode 470-1 and the second electrode 470-2 of the acoustic filter 450. As shown in FIG. 3, the acoustic filter 350 includes a semiconductor handle wafer 352, having a front-side that is bonded to the front-side dielectric layer 304 of the CMOS die 302 through a bond layer 354. The bond layer 354 may be provided on both wafers or on only one of the wafers.

According to a further aspect of the present disclosure, an integrated, on-chip acoustic filter is described. The integrated, on-chip acoustic filter includes means for handling the integrated, on-chip acoustic filter. The handling means may be the semiconductor handle wafer 352/452, for example, as shown in FIGS. 3 to 6. In another aspect, the aforementioned means may be any module, layer or any apparatus configured to perform the functions recited by the aforementioned means.

Figure 8:
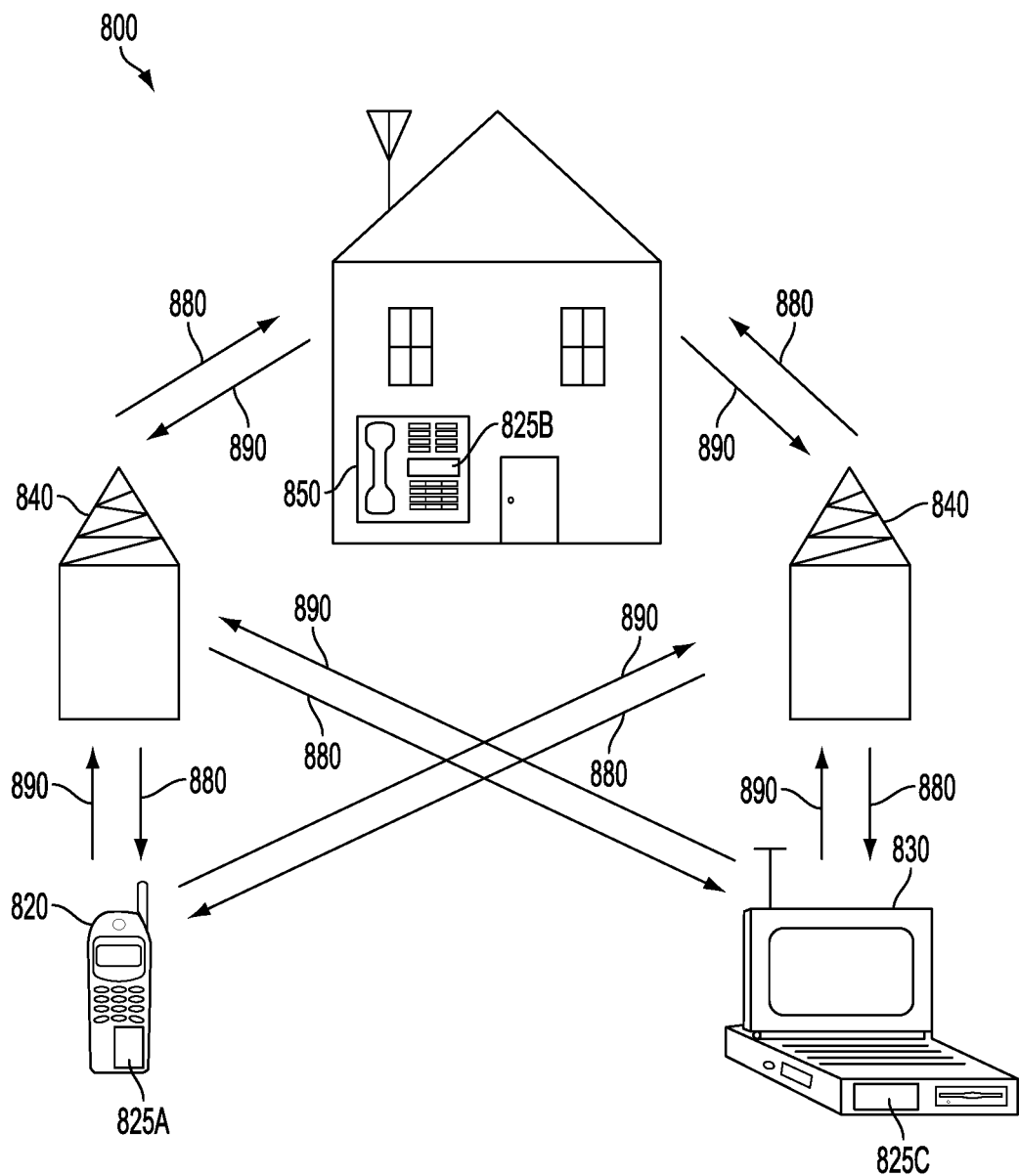
FIG. 8 is a block diagram showing an exemplary wireless communication system in which an aspect of the present disclosure may be advantageously employed.

FIG. 8 is a block diagram showing an exemplary wireless communication system 800 in which an aspect of the present disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed integrated, on-chip acoustic filter. It will be recognized that other devices may also include the disclosed integrated, on-chip acoustic filter, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the present disclosure, the present disclosure is not limited to these exemplary illustrated units.

Aspects of the present disclosure may be suitably employed in many devices, which include the disclosed integrated, on-chip acoustic filter.

Figure 9:
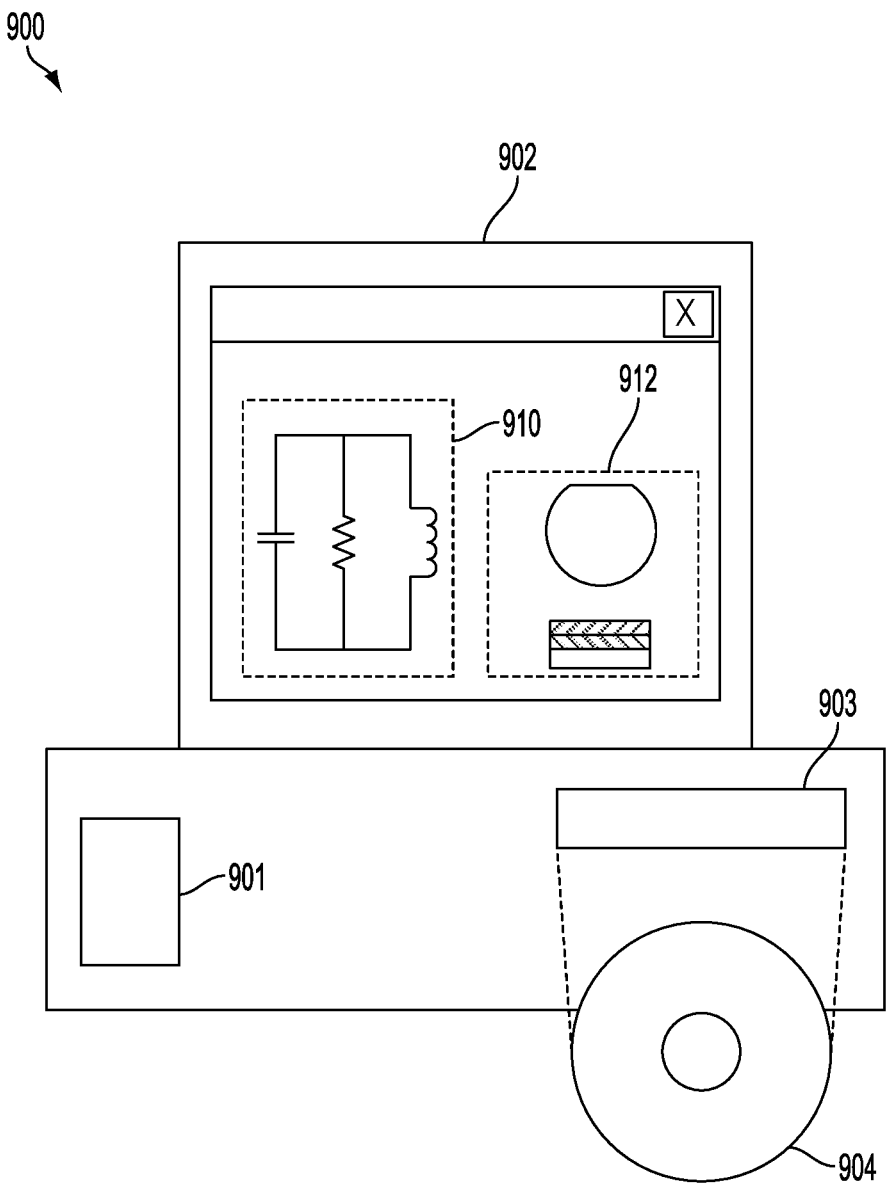
FIG. 9 is a block diagram illustrating a design workstation used for circuit, layout, and logic design of a semiconductor component, such as the RF filter-on-insulator devices disclosed above.

FIG. 9 is a block diagram illustrating a design workstation used for circuit, layout, and logic design of an RF component, such as the on-chip acoustic filter disclosed above. A design workstation 900 includes a hard disk 901 containing operating system software, support files, and design software such as Cadence or OrCAD. The design workstation 900 also includes a display 902 to facilitate a circuit design 910 or an integrated, on-chip acoustic filter 912. A storage medium 904 is provided for tangibly storing the circuit design 910 or the integrated, on-chip acoustic filter 912. The circuit design 910 or the integrated, on-chip acoustic filter 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the integrated, on-chip acoustic filter 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A radio frequency (RF) front-end (RFFE) device, comprising:
   a die including a front-side dielectric layer on an active device, the active device on a first semiconductor substrate located at a back-side of the die, and a plurality of back-end-of-line layers between the active device and the front-side dielectric layer; and
   a microelectromechanical system (MEMS) device integrated on the die at a different layer than the active device, the MEMS device having a cap layer comprised of a cavity in the front-side dielectric layer of the die, between the first semiconductor substrate and a second semiconductor substrate coupled to the front-side dielectric layer,
   in which the MEMS device comprises an acoustic filter, comprising:
      a second dielectric layer between the second semiconductor substrate and bonded to the front-side dielectric layer of the die and arranged opposite the cap layer; and
      a piezoelectric layer between a first electrode and a second electrode, the first electrode coupled to the second dielectric layer and an inert layer of the acoustic filter, the first electrode coupled to the active device through a first back-end-of-line (BEOL) interconnect, and the second electrode coupled to the dielectric layer and the inert layer of the acoustic filter, the second electrode coupled to a second BEOL interconnect.

2. The RFFE device of claim 1, in which the second semiconductor substrate comprises a semiconductor handle wafer, and in which the acoustic filter further comprises an inert gas between the semiconductor handle wafer and at least one of the first electrode and the second electrode.

3. The RFFE device of claim 1 in which the acoustic filter comprises a bulk acoustic wave (BAW) filter.

4. The RFFE device of claim 1, further comprising a bond layer between the second semiconductor substrate of the MEMS device and the front-side dielectric layer of the die.

5. The RFFE device of claim 1, in which the die comprises a complementary metal oxide semiconductor (CMOS) die or a radio frequency (RF) die.

6. The RFFE device of claim 1, in which the first semiconductor substrate comprises a semiconductor-on-insulator (SOI) wafer, and the second semiconductor substrate comprises a semiconductor handle wafer.

7. The RFFE device of claim 1, integrated into at least one of a music player, a video player, an entertainment unit, a navigation device, a communications device, a personal digital assistant (PDA), a fixed location data unit, a mobile phone, and a portable computer.

8. A radio frequency (RF) front-end (RFFE) device, comprising:
   a die including a front-side dielectric layer on an active device, the active device on a first semiconductor substrate located at a back-side of the die, and a plurality of back-end-of-line layers between the active device and the front-side dielectric layer; and
   a microelectromechanical system (MEMS) device integrated on the die at a different layer than the active device, the MEMS device having a cap layer comprised of a cavity in the front-side dielectric layer of the die, between the first semiconductor substrate and a second semiconductor substrate coupled to the front-side dielectric layer in which the MEMS device comprises an acoustic filter, comprising:
      a piezoelectric layer on the second semiconductor substrate, the piezoelectric layer bonded to the front-side dielectric layer; and
      a first electrode between the piezoelectric layer and the front-side dielectric layer and also between the piezoelectric layer and the cavity, the first electrode coupled to the active device through a first back-end-of-line (BEOL) interconnect.

9. The RFFE device of claim 8, in which the acoustic filter comprises a surface acoustic wave (SAW) filter.

10. The RFFE device of claim 8, further comprising a bond layer between the second semiconductor substrate of the MEMS device and the front-side dielectric layer of the die.

11. The RFFE device of claim 8, in which the die comprises a complementary metal oxide semiconductor (CMOS) die or a radio frequency (RF) die.

12. The RFFE device of claim 8, in which the first semiconductor substrate comprises a semiconductor-on-insulator (SOI) wafer, and the second semiconductor substrate comprises a semiconductor handle wafer.

13. A radio frequency (RF) front-end (RFFE) device, comprising:
   an RFFE die including a front-side dielectric layer on an active device, the active device on a first semiconductor substrate located at a back side of the RFFE die, and a plurality of back-end-of-line layers between the active device and the front-side dielectric layer; and an acoustic filter integrated on the die at a different layer than the active device, the acoustic filter having a cap layer comprised of a cavity in the front-side dielectric layer of the die, between the first semiconductor substrate and a second semiconductor substrate coupled to the front-side dielectric layer, the acoustic filter comprising a second dielectric layer between the second semiconductor substrate and bonded to the front-side dielectric layer of the die and arranged opposite the cap layer; and a piezoelectric layer between a first electrode and a second electrode, the first electrode coupled to the second dielectric layer and an inert layer of the acoustic filter, the first electrode coupled to the active device through a first back-end-of-line (BEOL) interconnect, and the second electrode coupled to the dielectric layer and the inert layer of the acoustic filter, the second electrode coupled to a second BEOL interconnect; and an antenna coupled to an output of the acoustic filter.

14. The RFFE device of claim 13, in which the acoustic filter comprises a bulk acoustic wave (BAW) filter.

15. The RFFE device of claim 13, incorporated into at least one of a music player, a video player, an entertainment unit, a navigation device, a communications device, a personal digital assistant (PDA), a fixed location data unit, a mobile phone, and a portable computer.

16. A radio frequency (RF) front-end (RFFE) device, comprising:

an RFFE die including a front-side dielectric layer on an active device, the active device on a first semiconductor substrate located at a back side of the RFFE die, and a plurality of back-end-of-line layers between the active device and the front-side dielectric layer; and an acoustic filter integrated on the die at a different layer than the active device, the acoustic filter having a cap layer comprised of a cavity in the front-side dielectric layer of the die, between the first semiconductor substrate and a second semiconductor substrate coupled to the front-side dielectric layer, the acoustic filter comprising a filter layer on the second semiconductor substrate, the filter layer bonded to the front-side dielectric layer; and a first electrode between the filter layer and the front-side dielectric layer and also between the piezoelectric layer and the cavity, the first electrode coupled to the active device through a first back-end-of-line (BEOL) interconnect, in which the acoustic filter comprises a surface acoustic wave (SAW) filter; and an antenna coupled to an output of the acoustic filter.

* * * * *